United States Patent
Huang (10) Patent No.: US 9,800,255 B2
(45) Date of Patent: Oct. 24, 2017

(54) METHOD AND CIRCUIT FOR TESTING SUCCESSIVE APPROXIMATION ADC

(71) Applicant: REALTEK SEMICONDUCTOR CORPORATION, Hsinchu (TW)

(72) Inventor: Shih-Hsiung Huang, Miaoli County (TW)

(73) Assignee: REALTEK SEMICONDUCTOR CORPORATION, Hsinchu (TW)

( * ) Notice: Subject to any disclaimer, the term of this patent is extended or adjusted under 35 U.S.C. 154(b) by 0 days.

(21) Appl. No.: 15/332,630

(22) Filed: Oct. 24, 2016

(65) Prior Publication Data

US 2017/0134036 A1    May 11, 2017

(30) Foreign Application Priority Data

Nov. 11, 2015  (TW) .............................. 104137108 A (51) Int. Cl.
*H03M 1/10*   (2006.01)
*H03M 1/46*   (2006.01)

(52) U.S. Cl.
CPC ............ *H03M 1/109* (2013.01); *H03M 1/466* (2013.01)

(58) Field of Classification Search
CPC .... H03M 1/466; H03M 1/1071; H03M 1/109; H03M 1/1085
USPC .................................................. 341/120, 172
See application file for complete search history.

(56) References Cited

U.S. PATENT DOCUMENTS

| | | | |
|---|---|---|---|
| 8,477,052 B2 * | 7/2013 | Dey ...................... | H03M 1/109 341/118 |
| 8,854,240 B2 * | 10/2014 | Chen ...................... | H03M 1/06 341/118 |
| 8,970,408 B2 * | 3/2015 | Bogner .............. | G01R 31/2884 341/118 |
| 9,473,164 B1 * | 10/2016 | Chen ...................... | H03M 1/468 |

\* cited by examiner

*Primary Examiner* — Khai M Nguyen
(74) *Attorney, Agent, or Firm* — WPAT, P.C., Intellectual Property Attorneys; Anthony King (57) ABSTRACT

This invention discloses a method and a circuit for testing a successive approximation ADC. The test method includes the following steps: receiving a plurality of digital output codes of a SAR ADC; counting the number of odd numbers and the number of even numbers of the digital output codes; and determining whether an error occurs in the SAR ADC based on the number of odd numbers and the number of even numbers.

13 Claims, 13 Drawing Sheets

METHOD AND CIRCUIT FOR TESTING SUCCESSIVE APPROXIMATION ADC

BACKGROUND OF THE INVENTION

1. Field of the Invention

This invention relates to a successive approximation analog-to-digital converter (ADC) (a.k.a., a SAR ADC), especially to a test method and a test circuit for the successive approximation ADC.

2. Description of Related Art

Figure 1:
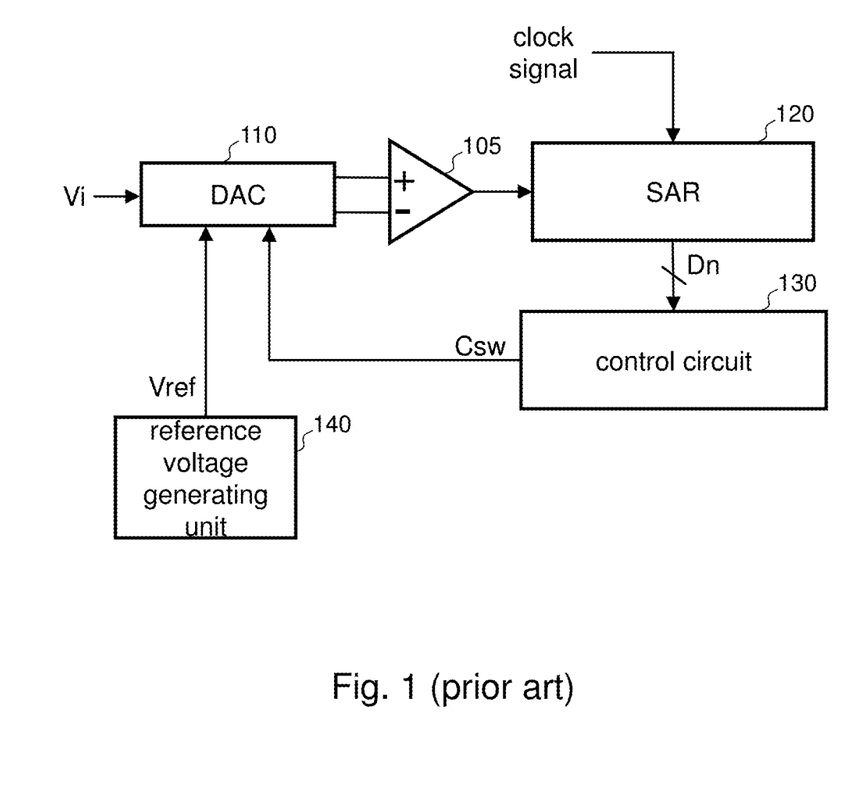
FIG. 1 illustrates a functional block diagram of a conventional charge redistribution successive approximation analog-to-digital converter (SAR ADC).

FIG. 1 illustrates a functional block diagram of a conventional charge redistribution successive approximation analog-to-digital converter (SAR ADC). In an operation period of the SAR ADC, the successive approximation register (SAR) 120 decides, according to the clock signal, one of the bit values (1/0) of a digital output code Dn based on a comparison result of the comparator 105. The control circuit 130 generates the control signal Csw according to the digital output code Dn. The digital-to-analog converter (DAC) 110 adjusts the switching state of the capacitor array provided therein according to the control signal Csw (e.g., controlling one end of a capacitor to be connected to ground or a reference voltage Vref). As a result, the charges on the capacitors redistribute, causing the voltage levels at the inverting input terminal and the non-inverting input terminal of the comparator 105 to change, and therefore one of the voltage levels to be compared in the next operation period of the SAR ADC is changed. By repeating the above procedures, the value represented by the digital output code Dn approaches the amplitude of the input signal Vi as the digital output code Dn is decided in an order from the most significant bit (MSB) to the least significant bit (LSB).

A differential nonlinear (DNL) error of the SAR ADC is often observed in determining whether the SAR ADC meets the design criteria. This approach, however, needs to collect a large amount of DNL errors; for example, a 12-bit SAR ADC needs 40960 sets of data (10 sets of data being collected for each digital value), and all the data needs to be processed by digital signal processing (DSP) before it can be analyzed to obtain the characteristics of the DNL errors. Such huge amount of data and the DSP operation render the testing inefficient.

SUMMARY OF THE INVENTION

In view of the issues of the prior art, an object of the present invention is to provide a test method and test circuit of a successive approximation analog-to-digital converter (SAR ADC) to improve the efficiency of testing the SAR ADC.

The present invention discloses a test method of a successive approximation analog-to-digital converter (SAR ADC), comprises the steps of: receiving a plurality of digital output codes of the SAR ADC; counting the number of odd numbers and the number of even numbers of the digital output codes; calculating at least one of a first ratio and a second ratio, wherein the first ratio is a ratio of the number of odd numbers to the number of even numbers and the second ratio is a ratio of the number of even numbers to the number of odd numbers; and determining whether there is an error in the SAR ADC the by comparing at least one of the first ratio and the second ratio with a predetermined value.

The present invention also discloses a test circuit of a successive approximation analog-to-digital converter (SAR ADC) for detecting an error of the SAR ADC according to a plurality of digital output codes of the SAR ADC. The test circuit comprises a counter configured to count the number of odd numbers and the number of even numbers of the digital output codes, and a processing unit configured to calculate at least one of a first ratio and a second ratio and determine whether there is an error in the SAR ADC by comparing at least one of the first ratio and the second ratio with a predetermined value. The first ratio is a ratio of the number of odd numbers to the number of even numbers and the second ratio is a ratio of the number of even numbers to the number of odd numbers.

The present invention further discloses a test method of a charge redistribution successive approximation analog-to-digital converter (SAR ADC) that comprises a capacitor array, comprising the steps of: receiving a plurality of digital output codes of the charge redistribution SAR ADC; and estimating, according to a distribution of odd numbers or even numbers of the digital output codes, an operation period of the charge redistribution SAR ADC during which an error occurs. The operation period comprises a switching phase in which charges on the capacitor array redistribute and a comparing phase in which a bit value of one of the digital output codes is determined.

The test method and the test circuit of the SAR ADC of this invention use the digital output codes (or values) of the SAR ADC to determine whether errors occur. Whether the SAR ADC functions properly can be rapidly learned by merely comparing the number of even numbers and the number of odd numbers of the digital output codes (or values). The test efficiency is improved because the test method and the test circuit of this invention require relatively less data, as opposed to the conventional method.

These and other objectives of the present invention no doubt become obvious to those of ordinary skill in the art after reading the following detailed description of the preferred embodiments with reference to the various figures and drawings.

DETAILED DESCRIPTION OF THE EMBODIMENTS

The following description is written by referring to terms of this technical field. If any term is defined in this specification, such term should be explained accordingly. In addition, the connection between objects or events in the below-described embodiments can be direct or indirect provided that these embodiments are practicable under such connection. Said "indirect" means that an intermediate object or a physical space exists between the objects, or an intermediate event or a time interval exists between the events.

This invention discloses test method and test circuit of a SAR ADC. The test method can be implemented by hardware and/or software and/or firmware, and can be performed by the test circuit of this invention or its equivalent circuits.

Figure 2A:
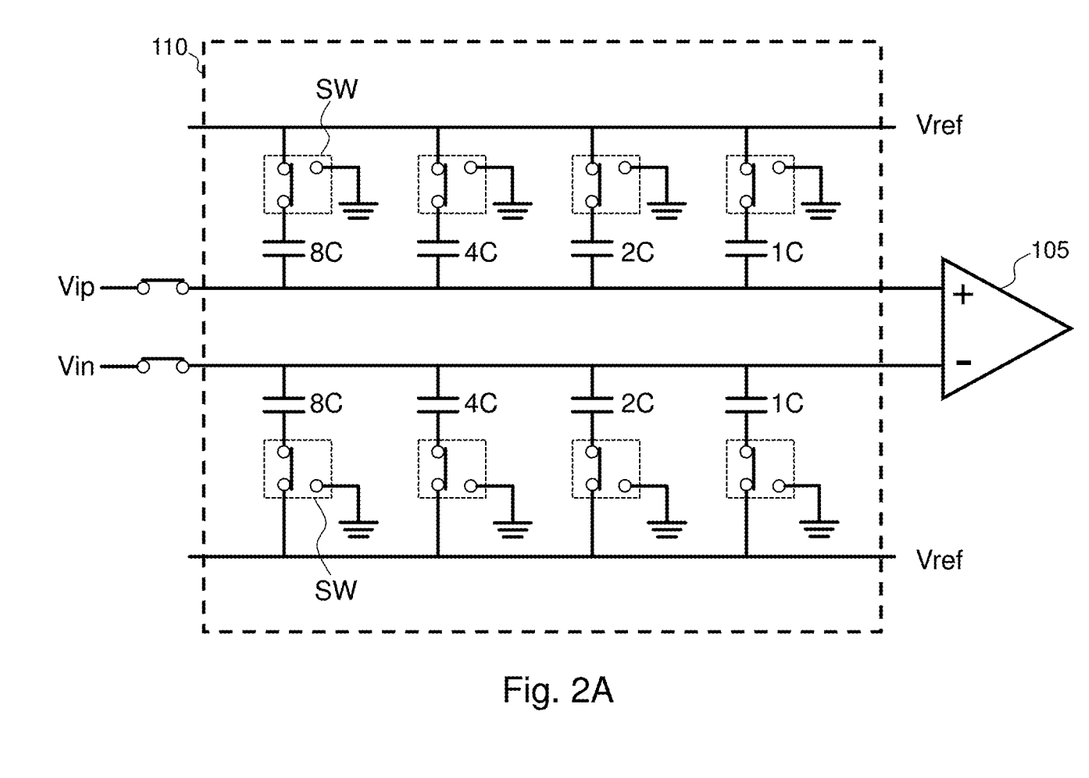
FIG. 2A-2C illustrate different switching states of a capacitor array of the charge redistribution SAR ADC.

The capacitor array inside the DAC 110 of FIG. 1 is illustrated in FIG. 2A. The input signal Vi is a differential signal and is denoted by a differential signal pair Vip and Vin. Each capacitor is coupled to the reference voltage Vref or ground through a switch SW. An on/off state of each switch SW is controlled by the control signal Csw. FIG. 2A illustrates a DAC 110 of a 5-bit SAR ADC. In the following, this circuit is taken as an example to describe the principles of the test mechanism according to an embodiment of this invention. Assuming that the reference voltage Vref is 0.5V and that the ideal digital value obtained after the input signal Vi is converted is 10000 (B1~B5, with B1 being the MSB and B5 being the LSB), the five operation periods of the SAR ADC can be summarized in Table 1. Note that the denotations 1C, 2C, 4C, and 8C only serve to represent the ratios among the capacitance values of the capacitors instead of representing the absolute capacitance values.

TABLE 1

| $N^{th}$ operation | switching phase of DAC (capacitors charging or charge redistribution) | comparing phase (deciding bit value) |
|---|---|---|
| 1 | All capacitors coupled to Vref, and the input signal Vi charging the capacitor array | B1 = 1 |
| 2 | At the + terminal, the capacitor 8 C coupled to ground and the other capacitors coupled to Vref; At the − terminal, all capacitors coupled to Vref. | B2 = 0 |
| 3 | At the + terminal, the capacitor 8 C coupled to ground and the other capacitors coupled to Vref; At the − terminal, the capacitor 4 C coupled to ground and the other capacitors coupled to Vref. | B3 = 0 |
| 4 | At the + terminal, the capacitor 8 C coupled to ground and the other capacitors coupled to Vref; At the − terminal, the capacitors 4 C and 2 C coupled to ground and the capacitors 8 C and 1 C coupled to Vref. | B4 = 0 |
| 5 | At the + terminal, the capacitor 8 C coupled to ground and the other capacitors coupled to Vref; At the − terminal, the capacitors 4 C, 2 C and 1 C coupled to ground and the capacitor 8 C coupled to Vref. | B5 = 0 |

Because this SAR ADC has five bits, a total number of five operation periods are required. Each operation period includes a DAC switching phase and a comparing phase. In the DAC switching phase of the first operation, one end of each capacitor is coupled to the differential signal Vi and the other coupled to the reference voltage Vref (as shown in FIG. 2A). In the DAC switching phases of subsequent operations, one end of the capacitors is only coupled to the comparator 105 but not the differential signal Vi, and the other coupled to the reference voltage Vref or ground according to the comparison result of the prior comparing phase. When a DAC switching phase is complete, the amount of charges on the capacitors reflects the voltage information of the differential signal Vi. In a comparing phase, the comparator 105 compares the amplitudes of the input signals at its inverting input terminal and non-inverting input terminal, and then the SAR 120 decides the bit value corresponding to the operation period according to the comparing result. Unfortunately, in the DAC switching phase, the reference voltage Vref of the reference voltage generating unit 140 may decrease as a result of the influence from the DAC 110; for example, the DAC 110 draws currents from the reference voltage generating unit 140, causing the reference voltage generating unit 140 to not be able to restore its original voltage before the comparing phase. If the reference voltage Vref cannot be restored to a required voltage level before the comparing phase, comparisons are then conducted based on erroneous voltage levels in the comparing phase, causing errors in the comparing result of that operation. Thus, it is probable that the subsequent bit values be wrong because the charge redistribution in the DAC switching phase is associated with the bit values that are already decided.

Figure 2B:
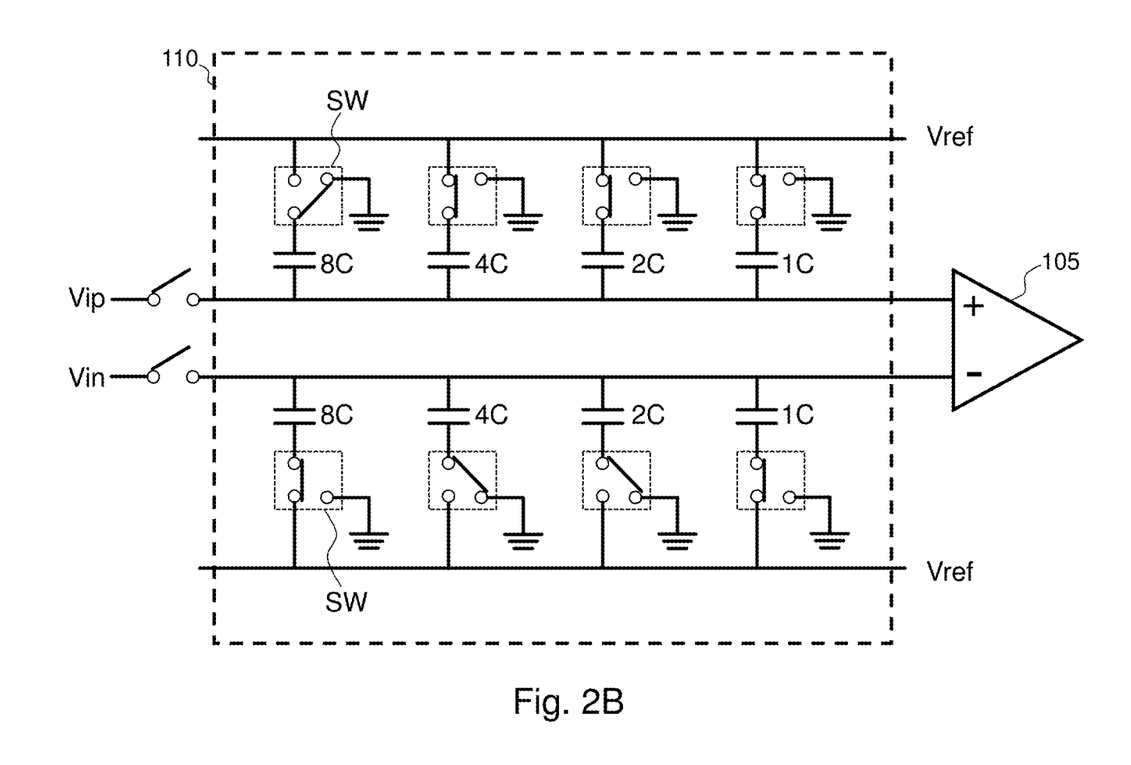

From the previous example, assuming that in the comparing phase of the fourth operation (the switch operations of the capacitors 8C, 4C and 2C are complete, as shown in FIG. 2B), the reference voltage Vref is not able to be restored to 0.5V (presumably to 0.49V only), an error caused by the 10 mV voltage difference at the non-inverting input terminal of the comparator 105 is:

$$Verror(+) = 10 \times \frac{8C}{1C + 2C + 4C + 8C} \approx 10 \times \frac{1}{2} \text{ mV} \quad (1)$$

and the error caused in the inverting input terminal is:

$$Verror(-) = 10 \times \frac{4C + 2C}{1C + 2C + 4C + 8C} \approx 10 \times \frac{3}{8} \text{ mV} \quad (2)$$

Therefore, the total error caused in the comparator 105 would be:

$$Verror = Verror(+) - Verror(-) = 10 \times \left(\frac{1}{2} - \frac{3}{8}\right) = 10 \times \frac{1}{8} \text{ mV} \quad (3)$$

Figure 2C:
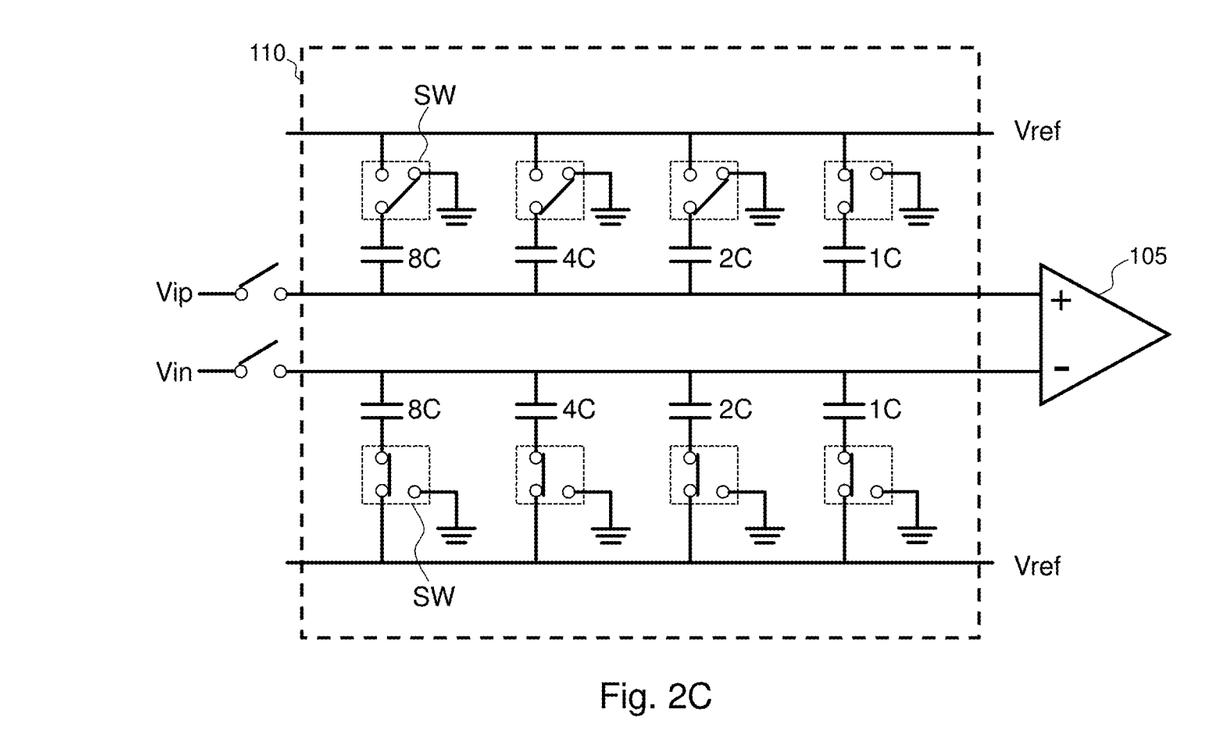

In other examples, however, it is assumed that the ideal digital value obtained after the input signal Vi is converted is 11110 and it is also assumed that there is still a 10 mV error in the reference voltage Vref in the comparing phase of the fourth operation (the switch operations of the capacitors 8C, 4C and 2C are complete, as shown in FIG. 2C), and so the total error would then be:

$$Verror = Verror(+) = 10 \times \frac{2C + 4C + 8C}{1C + 2C + 4C + 8C} \approx 10 \times \frac{7}{8} \text{ mV} \quad (4)$$

Figure 3:
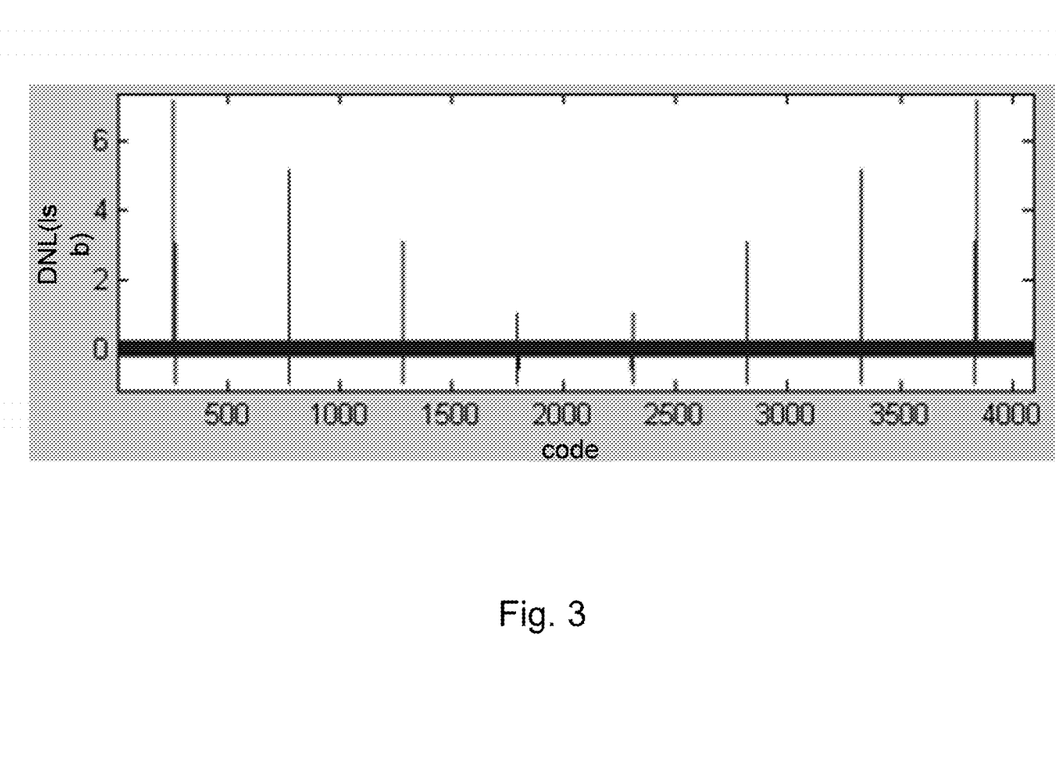
FIG. 3 illustrates a DNL-code chart.

Therefore, although in both cases discussed above, the reference voltage Vref is not able to be restored to the required voltage level after the switch operation of the capacitor 2C is complete, the respective errors caused in the comparator 105 are nonetheless different. In fact, this error is associated with the input signal Vi. The more the input signal Vi approaches the full swing of the ADC (e.g., the digital value corresponding to the input signal Vi is close to 11111 or 00000), the greater the error becomes. The above analysis explains why the DNLs at the left side and the right side (corresponding to full swing) in the DNL-code chart (as shown in FIG. 3 where a 12-bit ADC is used) are greater. And since FIG. 3 corresponds to the fourth operation period where the bit B4 of bits B1~B12 (B1 being MSB and B12 being LSB) is decided, the relatively large DNLs appear near codes that are odd multiples of 256, i.e., 256, 768, 1280, . . . , 3328, 3840 and so forth.

Figure 4:
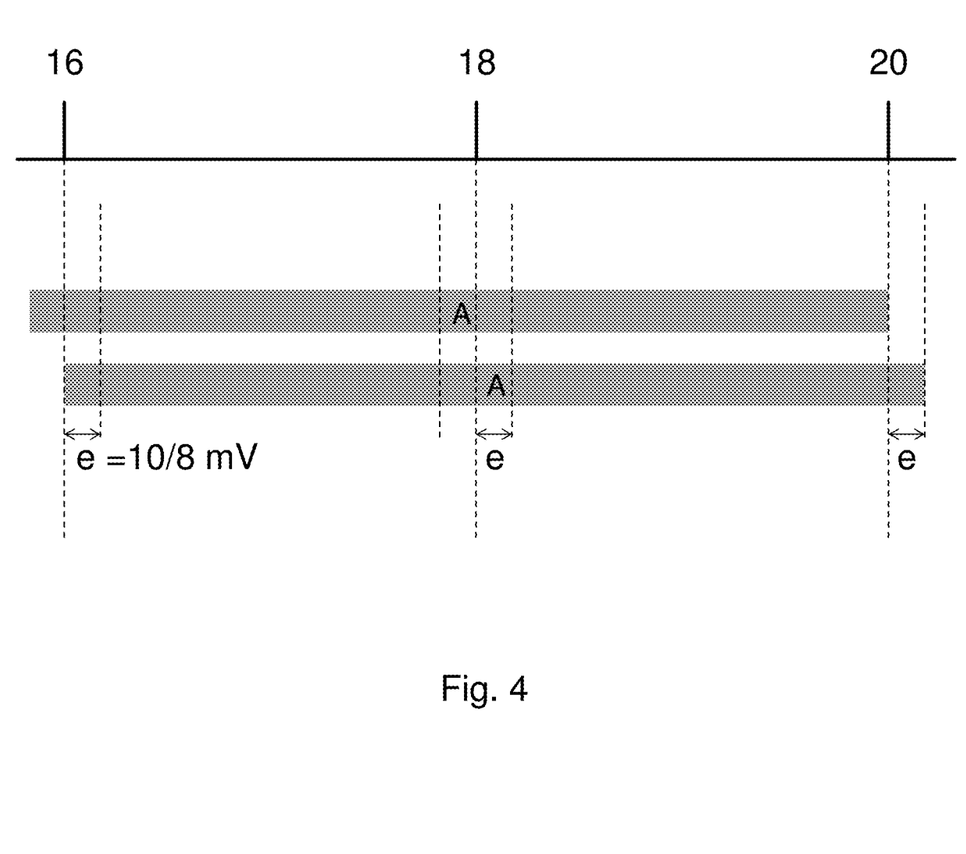
FIG. 4 illustrates how the error affects the ADC in determining the bit values.

The error mentioned above causes mistakes in the output of the ADC. FIG. 4 illustrates how the error affects the ADC in determining the bit values. FIG. 4 shows that the fourth operation (deciding bit B4) of a 5-bit ADC has an error e=10/8 mV, which causes the analog signal in an area A to shift from the left side of the value 18 (corresponding to a digital value of 10010) to the right side of the value 18. As a result, the bit B4 is mistakenly determined to be 1, which in turn causes the determination of subsequent bit values to be based upon an incorrect baseline (i.e., mistakenly comparing the analog signal within the area A in the region 16-18 with the levels in the region 18-20), and thus an occurrence of missing code takes place as the bit information inferior to B4 (only B5 left in this example) is lost. Because of this occurrence, the analog signal is determined as an even number whether its ideal digital value is an odd number (LSB=1) or an even number (LSB=0). The above discussion focuses on the case where B1=1 (i.e., corresponding to right half of the DNL-code chart of FIG. 3, in which the output codes are greater than half of the maximum output code (2048)). For the same reason, when B1=0 and the ideal digital value obtained after the input signal Vi is converted is assumed to be 01111, the error at the non-inverting input of the comparator 105 caused by the 10 mV voltage difference in the fourth operation is:

$$Verror(+) = 10 \times \frac{4C + 2C}{1C + 2C + 4C + 8C} \approx 10 \times \frac{3}{8} \quad (5)$$

The error corresponding to Equation (2) becomes:

$$Verror(-) = 10 \times \frac{8C}{1C + 2C + 4C + 8C} \approx 10 \times \frac{1}{2} \quad (6)$$

Therefore, the total error caused in the comparator 105 would be:

$$Verror = Verror(+) - Verror(-) = 10 \times \left(\frac{3}{8} - \frac{1}{2}\right) = -\frac{10}{8} \text{ mV} \quad (7)$$

That is, in the left half of the DNL-code chart of FIG. 3, in which the output codes are smaller than half of the maximum output code (2048), the error in the reference voltage Vref causes the analog signal to shift to the left and thus the analog signal is determined as an odd number whether the ideal digital value of the analog signal is an odd number or an even number.

From the above analysis, a non-ideal reference voltage Vref can cause a B-bit ADC to have more even numbers in output values greater than $2^{B-1}$ and to have more odd numbers in output values smaller than $2^{B-1}$. When a test to the ADC is conducted based on this feature, the required amount of data is greatly reduced as opposed to the conventional method because the present test simply compares the numbers of odd numbers and even numbers. For example, a 12-bit ADC needs only about 1000 sets of data to complete the test. Therefore, the test method of this invention greatly improves the test efficiency of the SAR ADC.

Figure 5A:
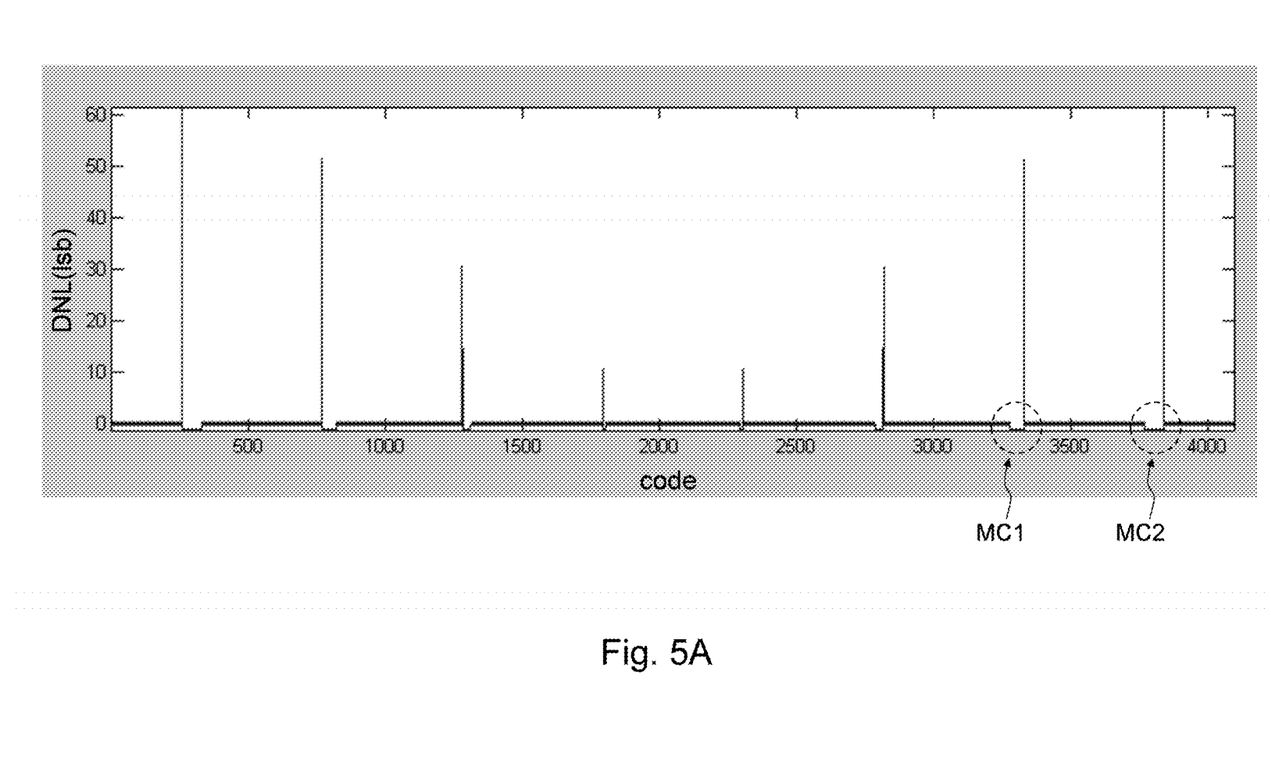
FIG. 5A illustrates another DNL-code chart.
Figure 5B:
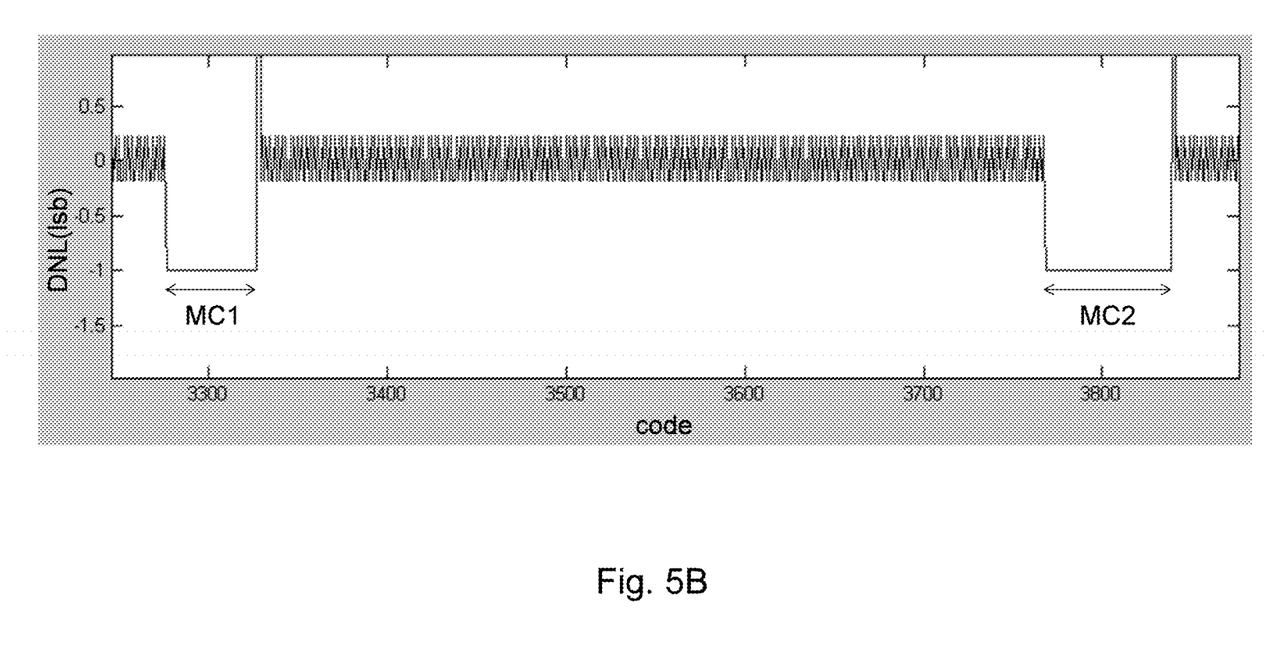
FIG. 5B illustrates a partially enlarged diagram of FIG. 5A.
Figure 6A:
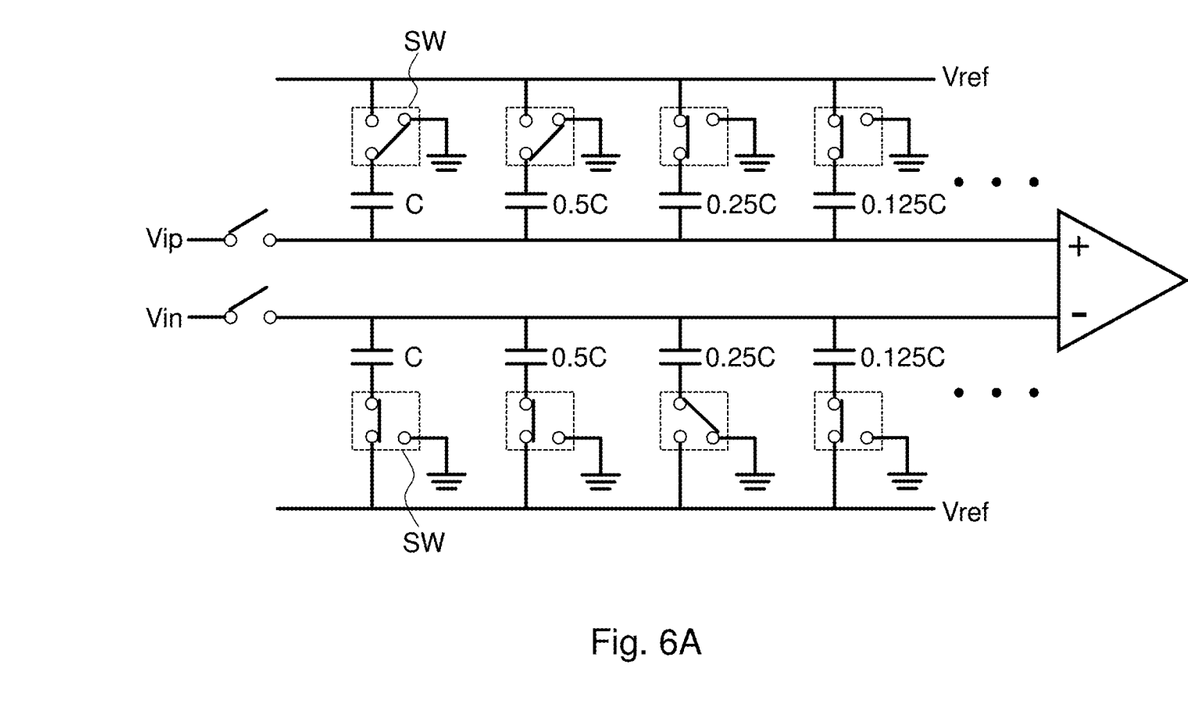
FIG. 6A-6B illustrates different switching states of a capacitor array of the charge redistribution SAR ADC.

FIG. 5A illustrates another DNL-code chart that emphasizes the amounts of missing codes at two regions MC1 and MC2, and FIG. 5B is a partially enlarged diagram of FIG. 5A. Obviously, when reference voltage Vref is not ideal, more missing codes are expected as the signals are closer to full swing. By measuring the detection result of FIG. 5B, it is shown that the width ratio of the two regions MC1:MC2≈1:1.375. FIG. 6 illustrates a switching state of the capacitors corresponding to the missing codes at the region MC1. Similarly, the denotations 1C, 0.5C, 0.25C, 0.125C, . . . only serve to represent the ratios among the capacitance values of the capacitors. Theoretically, the total error in this switching state is (where X is the error of reference voltage Vref):

$$Verror = Verror(+) - Verror(-) = X \times \left(\frac{1}{2} + \frac{1}{4} + \frac{1}{8}\right) = \frac{5}{8} X \quad (8)$$

Figure 6B:
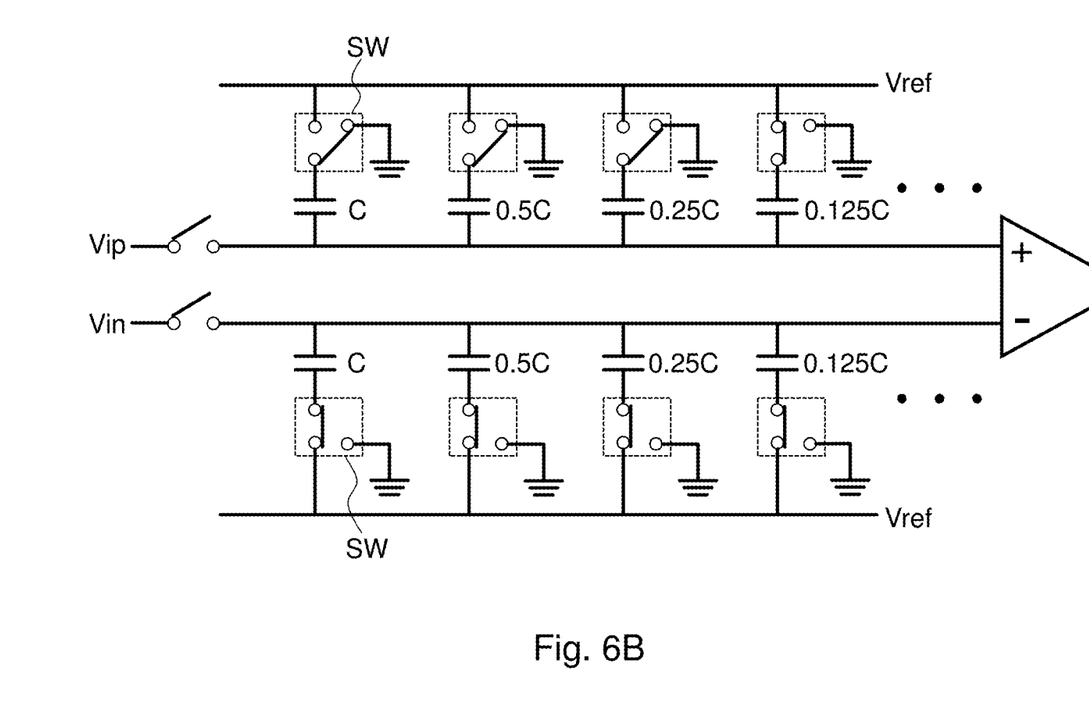

On the other hand, the switching state of the capacitors corresponding to the missing codes at the region MC2 is shown in FIG. 6B, and theoretically the total error in this switching state is:

$$Verror = Verror(+) - Verror(-) = X \times \left(\frac{1}{2} + \frac{1}{4} + \frac{1}{8} - 0\right) = \frac{7}{8} X \quad (9)$$

The theoretical width ratio of MC1:MC2=5:7=1:1.4, which is very close to the practical value. As such, the theory of the testing mechanism provided in this invention can be verified.

In addition to a non-ideal reference voltage Vref, a large resistance value of the switch SW can also result in missing codes. From practical measurements, the negative influence caused by the switch SW has substantially the same trends as the negative influence caused by the reference voltage Vref. Although the distribution in the DNL-code chart corresponding to a large resistance value in the switch SW is different from that corresponding to a low reference voltage Vref, the digital output code demonstrates the same trend when the resistance value of the switch SW is too large, i.e., the probability of the occurrence of even numbers is higher in the output codes with larger values (larger than half of the value of the maximum output code), and the probability of the occurrence of odd numbers is higher in the output codes with smaller values (smaller than half of the value of the maximum output code).

Figure 7:
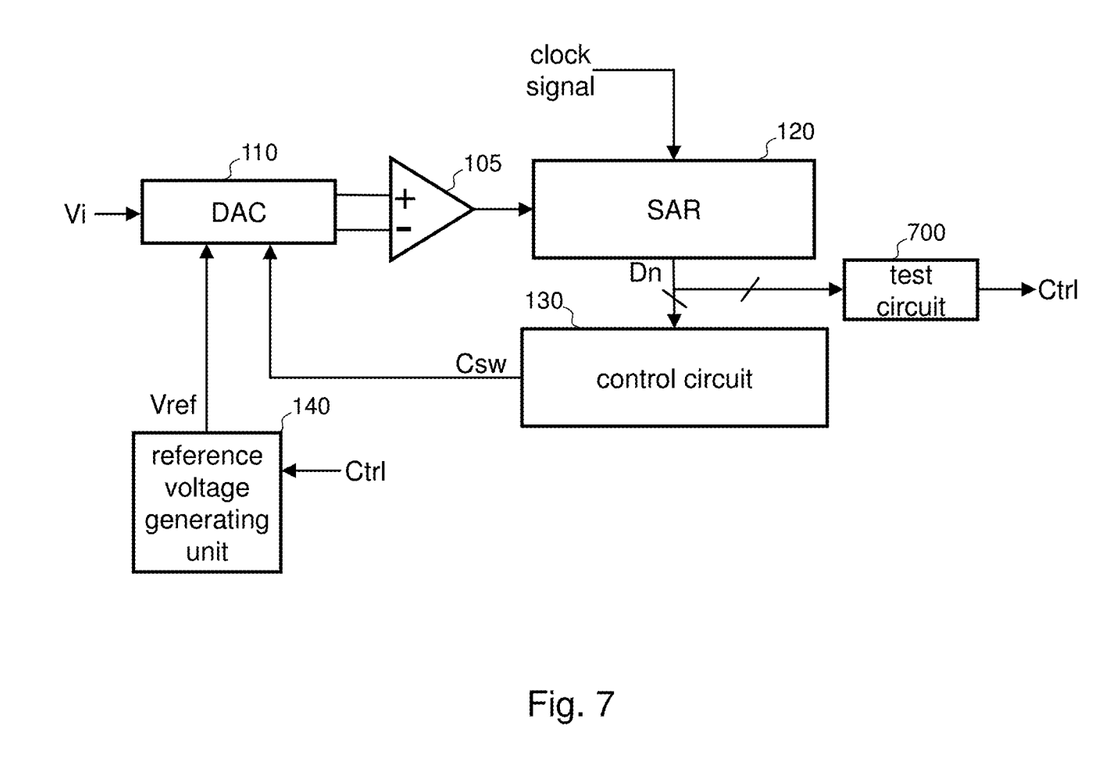
FIG. 7 illustrates a test circuit for the SAR ADC and the SAR ADC.
Figure 8:
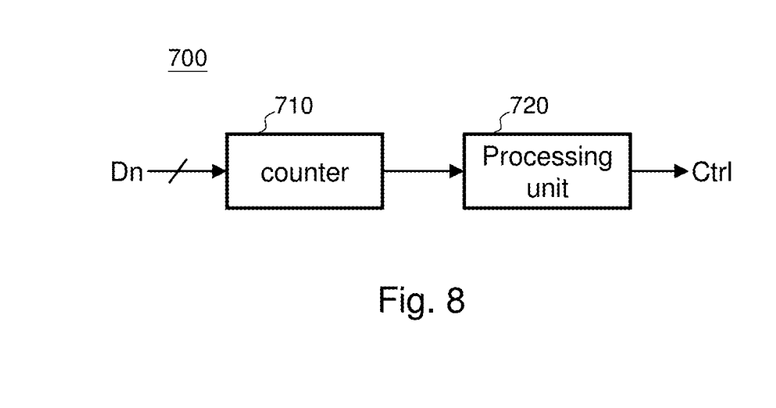
FIG. 8 illustrates a detailed functional block diagram of the test circuit.

Based on the above analysis, a test circuit and a corresponding test mechanism are provided to test whether a SAR ADC is functional. As shown in FIG. 7, a test circuit 700, which is coupled to the SAR 120, determines whether the SAR ADC needs to be adjusted by analyzing the digital output code Dn. FIG. 8 illustrates a detailed functional block diagram of the test circuit in FIG. 7. The test circuit 700 includes a counter 710 and a processing unit 720. Please also refer to FIG. 9, which is a flowchart of a method of testing the SAR ADC according to one embodiment of this invention. This method is performed by the test circuit 700. After the test circuit 700 receives the digital output code Dn of the SAR ADC (step S910), the counter 710 counts the number of odd numbers and the number of even numbers of the digital output code Dn (step S920), and then the processing unit 720 determines whether there is an error in the SAR ADC according to the number of odd numbers and the number of even numbers (step S930). To be specific, the processing unit 720 divides the digital output code Dn into two groups with respect to half the value of the maximum output code of the ADC and determines, for at least one group, a ratio of even numbers to odd numbers of the digital output code Dn. Taking a 12-bit ADC as an example, the half of the value of the maximum output code is $2^{11}=2048$, and any output code whose value is greater than 2048 belongs to the first group (corresponding to the right half of FIGS. 3 and 5A), and the remaining belongs to the second group (corresponding to the left half of FIGS. 3 and 5A). Then, at least one group is selected to find out the ratio of the number of even numbers to the number of odd numbers of the digital output code Dn in that group. For the group with greater values of the digital output code Dn, when the number of even numbers is obviously greater than the number of odd numbers (e.g., the ratio of the number of even numbers to the number of odd numbers is greater than a predetermined value), or for the group with smaller values of the digital output code Dn, when the number of odd numbers is obviously greater than the number of even numbers (e.g., the ratio of the number of odd numbers to the number of even numbers is greater than a predetermined value), it implies that the driving capability of the reference voltage generating unit 140 is insufficient. Because in this step the determination is carried out according to the ratio of even numbers to odd numbers or vice versa, the amount of data needed by the test circuit 700 is not that large, and therefore the test efficiency of the SAR ADC is greatly improved.

Figure 9:
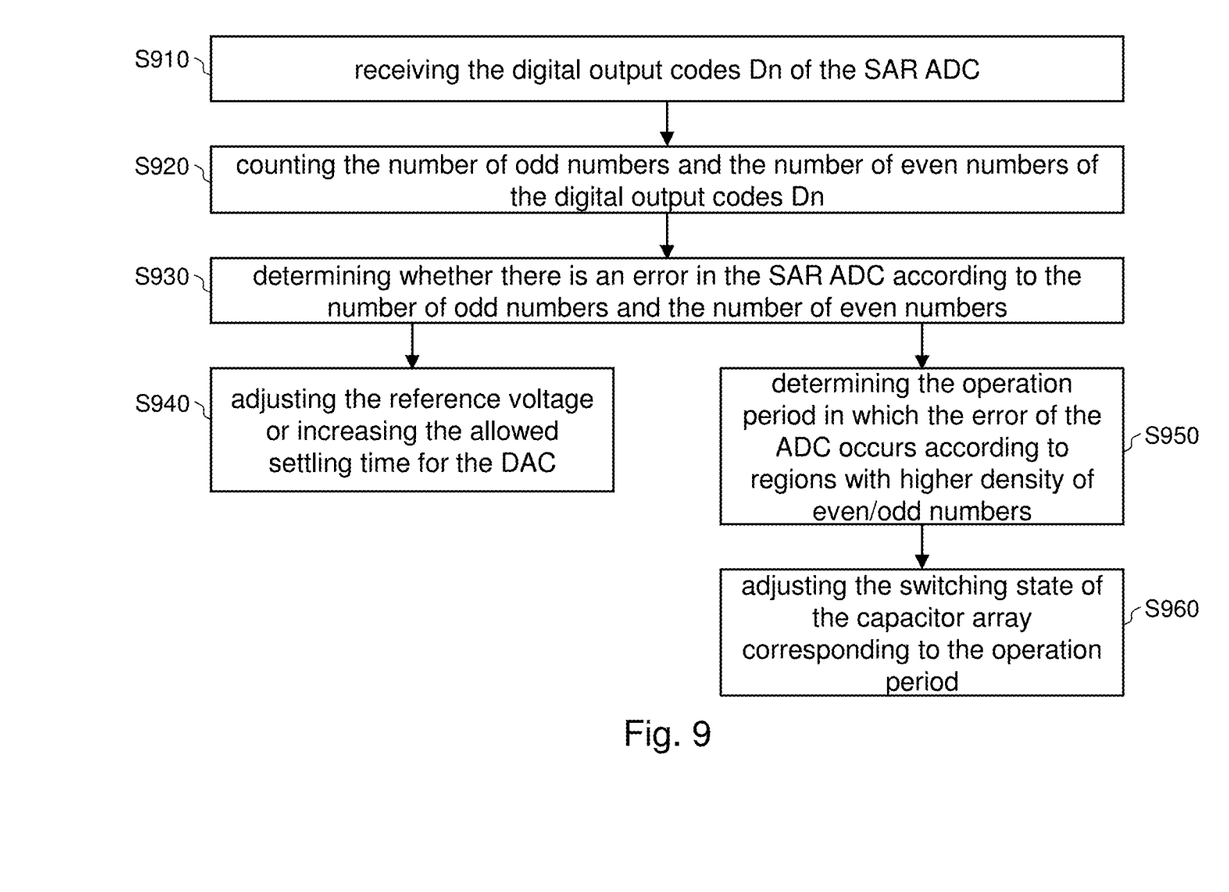
FIG. 9 illustrates a flowchart of a method of testing the SAR ADC according to one embodiment of this invention.

When the processing unit 720 determines that the ratio is greater than the predetermined value, which means that an error occurs, the processing unit 720 issues a control signal Ctrl to cause the reference voltage generating unit 140 to increase its driving capability by adjusting the reference voltage Vref, or, the processing unit 720 increases the allowed settling time for the DAC 110 such that there is sufficient time for the output of the reference voltage generating unit 140 to restore to the required voltage level (step S940). Optionally, the processing unit 720 can determine the operation period in which the error of the ADC occurs according to the digital output code Dn corresponding to a region where the density of even numbers (or odd numbers) is relatively high (i.e., a region having more missing codes) (step S950). For example, for a B-bit ADC, if an error occurs in the $N^{th}$ operation period, the digital output code Dn presents a relatively high density of even numbers (or odd numbers) in regions near odd multiples of $2^{B-N}$. When the SAR ADC is a charge redistribution SAR ADC, the processing unit 720 can then issue a control signal Ctrl to cause the DAC 110 to adjust the capacitor configuration in the DAC switching phase of the operation period in which the error occurs (step S960). For example, a mechanism of arbitrary weighted capacitor array (AWCA) can be employed to control the DAC 110 to perform a more precise capacitor switch operation and comparison near the digital output code Dn corresponding to which the error occurs, such that the misjudgment due to the error in the reference voltage can be alleviated.

Note that in the test method of this invention, it is optional to perform the step S940 or the steps S950 and S960 after the step S930. Alternatively, the steps S940~S960 can be all performed to further improve the accuracy of the ADC. Alternatively, the step S950 can be performed right after the digital output code of the ADC is obtained in the step S910 to determine the operation period in which an error occurs in the ADC. Moreover, since the overall power consumption of the ADC is increased as a result of an increase in the driving capability of the reference voltage generating unit 140, which is used as a means to eliminate the error in that DAC, and the error of the ADC only occurs in a certain DAC switching phase, employing the AWCA mechanism to conduct the calibration of the ADC can prevent extra power consumption resulted from the increase of the driving ability of the reference voltage generating unit 140.

Note that in a different embodiment the test circuit 710 can be integrated into the control circuit 130. Further, differential signals are served merely as examples in the above embodiments, and the invention can also be applied to non-differential signals.

Since people of ordinary skill in the art can appreciate the implementation detail and the modification thereto of the present method invention of FIG. 7 and FIG. 8 through the disclosure of the device invention of FIG. 9, repeated and redundant description is thus omitted. Please note that there is no step sequence limitation for the method inventions as long as the execution of each step is applicable. Furthermore, the shape, size, and ratio of any element and the step sequence of any flow chart in the disclosed figures are exemplary for understanding, not for limiting the scope of this invention. Moreover, although the above embodiments take the charge redistribution SAR ADC as an example, the charge redistribution SAR ADC is not meant to limit the scope of this invention. People of ordinary skill in the art can apply this invention to other types of SAR ADCs according to the disclosure of this invention.

The aforementioned descriptions represent merely the preferred embodiments of the present invention, without any intention to limit the scope of the present invention thereto. Various equivalent changes, alterations, or modifications based on the claims of the present invention are all consequently viewed as being embraced by the scope of the present invention.

What is claimed is:

1. A test method of a successive approximation analog-to-digital converter (SAR ADC), comprising:
  receiving a plurality of digital output codes of said SAR ADC;
  counting the number of odd numbers and the number of even numbers of said digital output codes;
  calculating at least one of a first ratio and a second ratio, wherein said first ratio is a ratio of said number of odd numbers to said number of even numbers and said second ratio is a ratio of said number of even numbers to said number of odd numbers; and
  determining whether there is an error in said SAR ADC by comparing at least one of said first ratio and said second ratio with a predetermined value.

2. The test method of claim 1, wherein said step of counting said number of odd numbers and said number of even numbers of said digital output codes counts said number of odd numbers and said number of even numbers according to a part of said digital output codes.

3. The test method of claim 2, wherein a value of said part of said digital output codes is greater than half of a value of a maximum digital output code of said SAR ADC, and said step of determining whether there is an error in said SAR ADC by comparing at least one of said first ratio or said second ratio with said predetermined value further comprises:
  determining whether said second ratio is greater than said predetermined value; and if said second ratio is greater than said predetermined value, determining that there is an error in said SAR ADC.

4. The test method of claim 2, wherein a value of said part of said digital output code is smaller than half of a value of a maximum digital output code of said SAR ADC, and said step of determining whether there is an error in said SAR ADC by comparing at least one of said first ratio or said second ratio with a predetermined value further comprises:
   determining whether said first ratio is greater than said predetermined value; and
   if said first ratio is greater than said predetermined value, determining that there is an error in said SAR ADC.

5. The test method of claim 1, wherein said SAR ADC is a charge redistribution SAR ADC and comprises a capacitor array, and said method further comprises:
   estimating an operation period during which an error occurs in said SAR ADC according to a digital output code corresponding to a relatively dense region of said odd numbers or said even numbers; and
   adjusting a switching state of said capacitor array corresponding to said operation period.

6. A test circuit of a successive approximation analog-to-digital converter (SAR ADC) for detecting an error of said SAR ADC according to a plurality of digital output codes of said SAR ADC, said test circuit comprising:
   a counter, for counting the number of odd numbers and the number of even numbers of said digital output codes; and
   a processing unit, for calculating at least one of a first ratio and a second ratio, and determining whether there is an error in said SAR ADC by comparing at least one of said first ratio and said second ratio with a predetermined value, wherein said first ratio is a ratio of said number of odd numbers to said number of even numbers and said second ratio is a ratio of said number of even numbers to said number of odd numbers.

7. The test circuit of claim 6, wherein said processing unit determines whether there is an error in said SAR ADC according to said number of odd numbers and said number of even numbers, which are corresponding to a part of said digital output codes.

8. The test circuit of claim 7, wherein a value of said part of said digital output codes is greater than half of a value of a maximum digital output code of said SAR ADC, and said processing unit further determines whether said second ratio is greater than said predetermined value, and if said second ratio is greater than said predetermined value, said processing unit determines that there is an error in said SAR ADC.

9. The test circuit of claim 7, wherein a value of said part of said digital output codes is smaller than half of a value of a maximum digital output code of said SAR ADC, and said processing unit further determines whether said first ratio is greater than said predetermined value, and if said first ratio is greater than said predetermined value, said processing unit determines that there is error in said SAR ADC.

10. The test circuit of claim 6, wherein said SAR ADC is a charge redistribution SAR ADC and comprises a capacitor array, and said processing unit further performs the following steps:
    estimating an operation period during which an error occurs in said SAR ADC according to a digital output code corresponding to a relatively dense region of said odd numbers or said even numbers; and
    generating a control signal for adjusting a switching state of said capacitor array corresponding to said operation period.

11. A test method of a charge redistribution successive approximation analog-to-digital converter (SAR ADC) that comprises a capacitor array, comprising:
    receiving a plurality of digital output codes of said charge redistribution SAR ADC; and
    estimating, according to a distribution of odd numbers or even numbers of said digital output codes, an operation period of said charge redistribution SAR ADC during which an error occurs;
    wherein, said operation period comprises a switching phase in which charges on said capacitor array redistribute and a comparing phase in which a bit value of one of said digital output codes is determined.

12. The method of claim 11, wherein said step of estimating said operation period of said charge redistribution SAR ADC comprises:
    estimating said operation period according to a digital output code corresponding to a relatively dense region of said odd numbers or said even numbers of said digital output codes.

13. The method of claim 11, wherein said charge redistribution SAR ADC further comprises a plurality of switches, and said method further comprises:
    adjusting a switching state of said capacitor array corresponding to said operation period by changing on/off states of said switches.

* * * * *